US010999934B2

(12) United States Patent
Lee et al.

(10) Patent No.: US 10,999,934 B2
(45) Date of Patent: May 4, 2021

(54) METAL OXIDE NANOPARTICLE INK COMPOSITION, METHOD OF PRODUCING SAME, AND METHOD OF FORMING CONDUCTIVE LAYER PATTERN USING SAME

(71) Applicant: Gachon University of Industry-Academic Cooperation Foundation, Seongnam-si (KR)

(72) Inventors: Daeho Lee, Seoul (KR); Nam Binh Vu, Seongnam-si (KR)

(73) Assignee: GACHON UNIVERSITY OF INDUSTRY-ACADEMIC COOPERATION FOUNDATION, Seongnam-si (KR)

( * ) Notice: Subject to any disclaimer, the term of this patent is extended or adjusted under 35 U.S.C. 154(b) by 0 days.

(21) Appl. No.: 16/385,468

(22) Filed: Apr. 16, 2019

(65) Prior Publication Data
US 2019/0327836 A1    Oct. 24, 2019

(30) Foreign Application Priority Data
Apr. 18, 2018    (KR) .......................... 10-2018-0044865

(51) Int. Cl.
*H05K 3/02*    (2006.01)
*H05K 1/09*    (2006.01)
*C09D 11/52*    (2014.01)

(52) U.S. Cl.
CPC ............ *H05K 3/027* (2013.01); *C09D 11/52* (2013.01); *H05K 1/097* (2013.01); *H05K 2201/0257* (2013.01); *H05K 2203/107* (2013.01)

(58) Field of Classification Search
CPC ..................................................... H05K 3/027
See application file for complete search history.

(56) References Cited

U.S. PATENT DOCUMENTS

| | | | |
|---|---|---|---|
| 10,214,833 B1 * | 2/2019 | Kaehr ..................... | C30B 29/60 |
| 2009/0274833 A1 * | 11/2009 | Li ......................... | C09D 11/037 |
| | | | 427/123 |
| 2015/0064057 A1 * | 3/2015 | Grigoropoulos ...... | C23C 18/143 |
| | | | 420/441 |

OTHER PUBLICATIONS

Hong Zhang, Jiaqi Cheng, Francis Lin, Hexiang He, Jian Mao, Kam Sing Wong, Alex K.-Y. Jen and Wallace C. H. Choy/ Pinhole-Free and Surface-Nanostructured NiOx Film by Room-Temperature Solution Process for High-Performance Flexible Perovskite Solar Cells with Good Stability and Reproducibility/American Chemical Society(ACS) Nano 2016, 10, 1503-1511/ACS Publications.

* cited by examiner

*Primary Examiner* — Austin Murata

(57) ABSTRACT

The present invention relates to a metal oxide nanoparticle ink composition, a method of producing the same, and a method of forming a conductive layer pattern by using the metal oxide nanoparticle ink composition, and more particularly, to a metal oxide nanoparticle ink composition for forming a conductive layer by irradiating an ink composition thin film containing nickel oxide nanoparticles with a sintering laser, a method of producing the same, and a method of forming a conductive layer pattern by using the metal oxide nanoparticle ink composition.

4 Claims, 17 Drawing Sheets

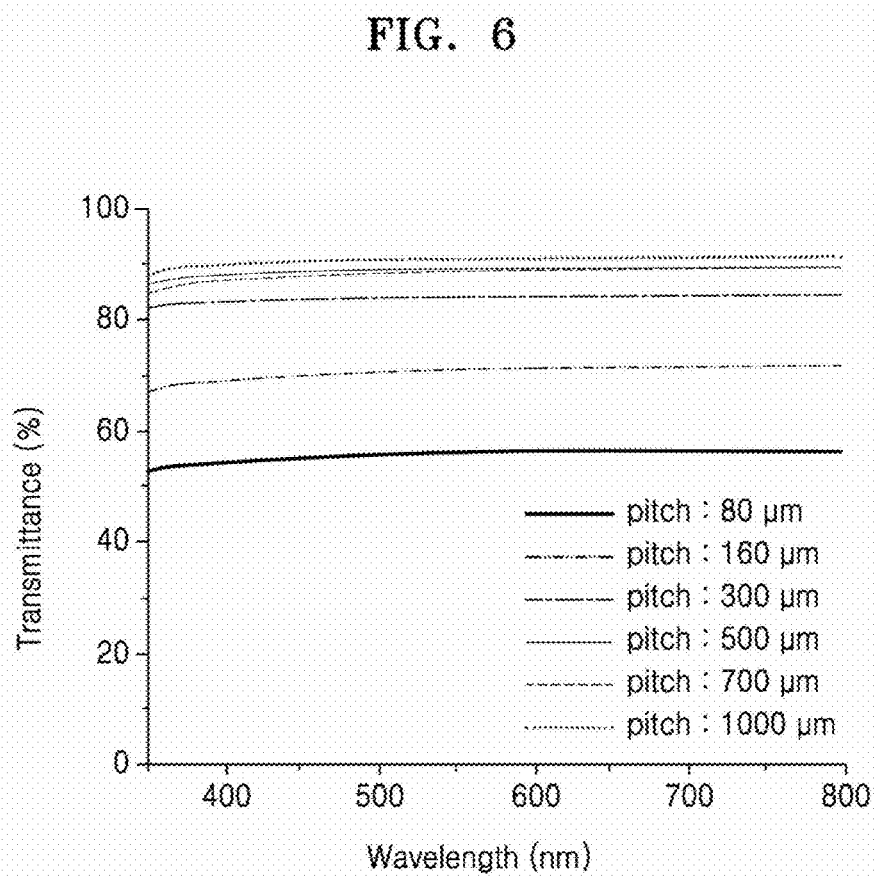

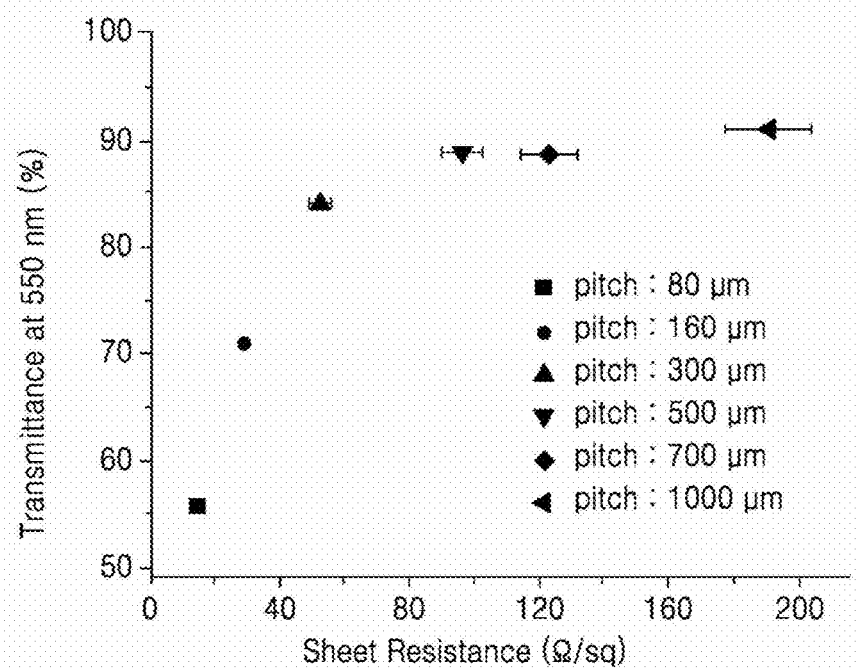

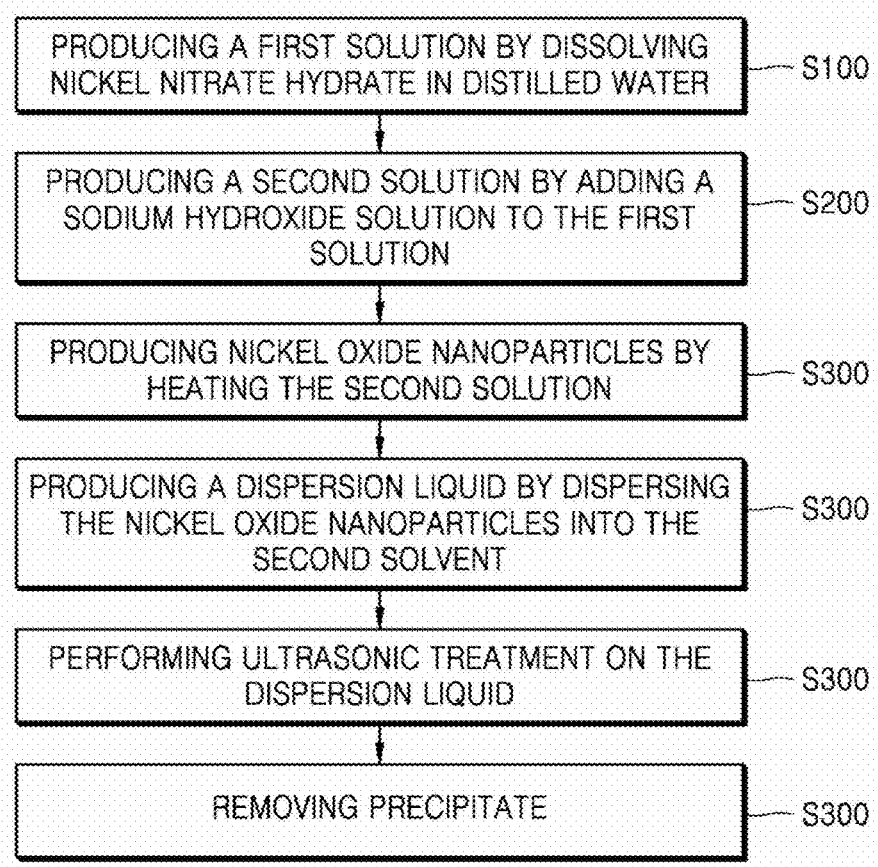

FIG. 9A
FIG. 9B
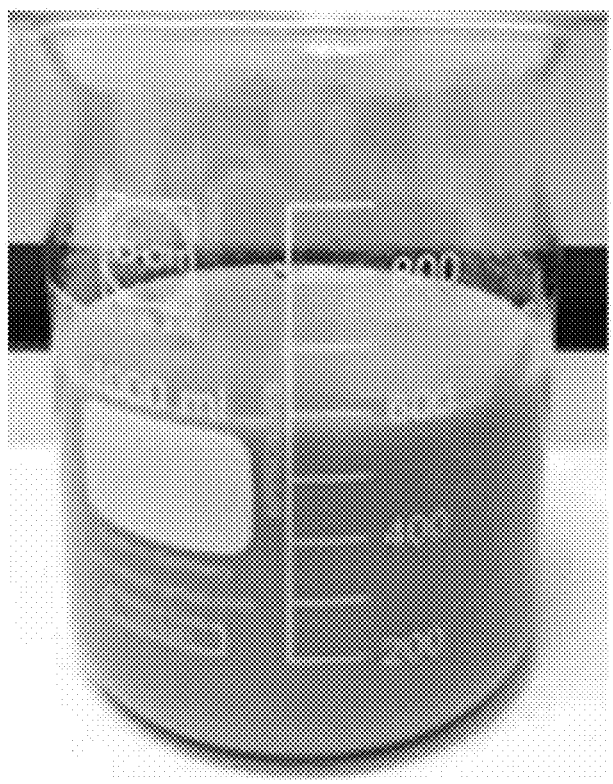
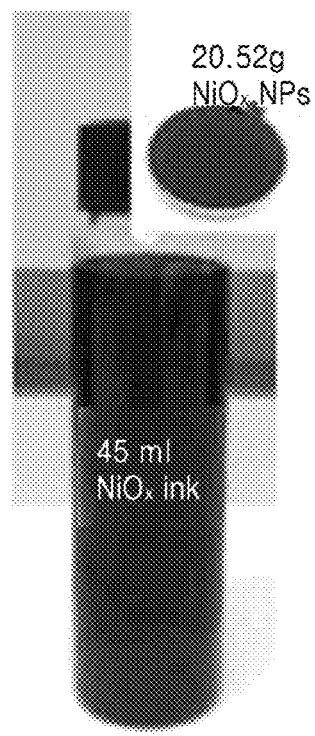

FIG. 11A
FIG. 11B
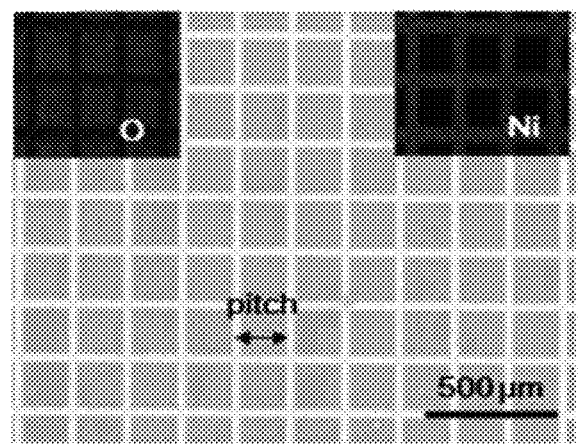
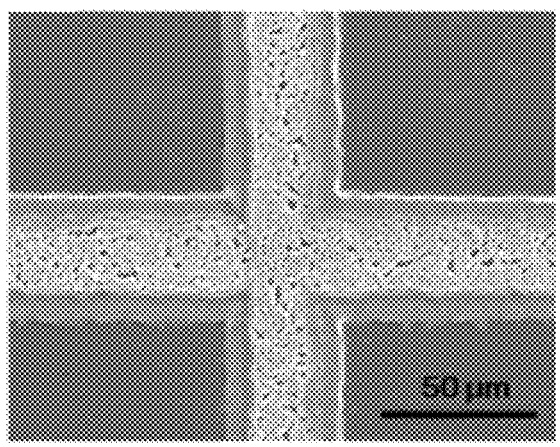

METAL OXIDE NANOPARTICLE INK COMPOSITION, METHOD OF PRODUCING SAME, AND METHOD OF FORMING CONDUCTIVE LAYER PATTERN USING SAME

BACKGROUND OF THE INVENTION

1. Field of the Invention

The present invention relates to a metal oxide nanoparticle ink composition, a method of producing the same, and a method of forming a conductive layer pattern by using the metal oxide nanoparticle ink composition, and more particularly, to a metal oxide nanoparticle ink composition forming a conductive layer by irradiating an ink composition thin film containing nickel oxide nanoparticles with a sintering laser, a method of producing the same, and a method of forming a conductive layer pattern by using the metal oxide nanoparticle ink composition.

2. Description of the Related Art

In the conventional semiconductor process, a circuit board is formed with a circuit pattern for electrically connecting circuit elements to an insulating substrate formed of a Bakelite or a synthetic resin. The manufacturing scheme is mainly divided into a subtractive scheme and an additive scheme.

According to the subtractive scheme, a portion other than a necessary circuit pattern is removed by etching or the like in a state where the conductive thin film is entirely formed on the substrate. According to the additive scheme, the circuit pattern is directly formed on the substrate by using a plating or printing technique.

Recently, most circuit boards are manufactured by the etching as a typical subtractive scheme. According to the etching scheme, after an acid resistant material (a resist) is applied only onto a portion corresponding to a circuit pattern on a surface of a laminated plate formed by applying a copper foil onto an insulating substrate, a portion other than the circuit pattern is dissolved and removed by using an etching solution, so that the circuit pattern is formed.

However, when a circuit board is manufactured by the above-described etching scheme, since complicated process such as formation of the laminated plate, coating of the resist, and etching and washing of the resist are required, the manufacturing process takes a long time and the manufacturing cost rises.

In addition, the effluent generated during the manufacturing process causes environmental pollution, and the treatment such as neutralization is inevitably required to prevent the pollution, thereby causing another cost increase.

The additive scheme is an alternative for solving the disadvantages due to the etching during the circuit board manufacturing process, in which a circuit pattern is implemented by directly printing conductive ink on a substrate by using a printing scheme such as inkjet printing, so that it is easier and cheaper to manufacture the circuit board.

Because the pattern can be printed with a desired thickness in a desired place, the manufacturing process can be simplified, the manufacturing cost can be reduced, and the environmental pollution can be prevented, the additive scheme has been widely used in various field.

Ink sintering in the additive scheme may be mainly classified into a thermal sintering scheme and a laser sintering scheme. However, the commercialized thermal sintering scheme and laser sintering scheme require high energy and long sintering time, thereby causing problems such as cost increase.

In addition, recently, a silver or copper lattice electrode has attracted attention as a transparent flexible conductive layer due to high transmittance and high conductivity. In the case of an electrode formed by using nickel, a manufacturing method of a touch screen using a nickel lattice electrode formed on a glass substrate is well known. Although a method of forming an electrode by using a toluene molecule as a reductant upon formation of the nickel lattice electrode is well known, an electrode cannot be formed on a substrate formed of transparent flexible polymer such as polyethylene terephthalate (PET) other than a glass substrate when the above method is used.

SUMMARY OF THE INVENTION

The present invention provides a metal oxide nanoparticle ink composition forming a conductive layer by irradiating an ink composition thin film containing nickel oxide nanoparticles with a sintering laser, a method of preparing the same, and a method of forming a conductive layer pattern by using the metal oxide nanoparticle ink composition.

To solve the above problem, the present invention provides a metal oxide nanoparticle ink composition for forming a conductive layer pattern, which includes a first solvent; nickel oxide ($NiO_x$) nanoparticles dispersed in the first solvent; and polyvinylpyrrolidone (PVP).

According to the present invention, the metal oxide nanoparticle ink composition may further include hexadecyltrimethylammonium bromide (CTAB) dispersed in the first solvent.

According to the present invention, the first solvent may be 1-pentanol.

According to the present invention, the metal oxide nanoparticle ink composition may include 25 g to 30 g of nickel oxide nanoparticles, 2 g to 4 g of polyvinylpyrrolidone (PVP) and 0.15 g to 0.25 g of hexadecyltrimethylammonium bromide (CTAB) per 100 ml of 1-pentanol.

To solve the above problem, the present invention provides a method of producing metal oxide nanoparticle ink composition for forming the conductive layer pattern, which includes: a first solution producing step of producing a first solution by dissolving nickel nitrate hydrate ($Ni(NO_3)_2 \cdot xH_2O$) in distilled water; a second solution producing step of producing a second solution by adding a sodium hydroxide (NaOH) solution to the first solution; a nanoparticle preparing step of preparing nickel oxide nanoparticles by heating the second solution in air at 250° C. to 300° C. for 1 to 3 hours;

a dispersion liquid producing step of producing a dispersion liquid by dispersing the prepared nickel oxide nanoparticles in a second solvent; an ultrasonic treatment step of performing an ultrasonic treatment on the produced dispersion liquid; and a precipitate removing step of removing precipitates of the dispersion liquid subjected to the ultrasonic treatment;

According to the present invention, the second solvent may include an organic solvent; and polyvinylpyrrolidone (PVP) dispersed in the organic solvent.

According to the present invention, the second solvent further includes hexadecyltrimethylammonium bromide (CTAB) dispersed in the organic solvent, and the organic solvent may be 1-pentanol.

According to the present invention, the metal oxide nanoparticle ink composition may include 25 g to 30 g of nickel oxide nanoparticles, 2 g to 4 g of polyvinylpyrrolidone (PVP) and 0.15 g to 0.25 g of hexadecyltrimethylammonium bromide (CTAB) per 100 ml of 1-pentanol.

According to the present invention, in the second solution producing step, a sodium hydroxide (NaOH) solution may be added, such that pH of the second solution is 9.5 to 10.5.

According to the present invention, the ultrasonic treatment may be performed for 10 hours or more.

To solve the above problem, the present invention provides a method of forming the conductive layer pattern, which includes: a metal oxide thin film forming step of forming a metal oxide thin film by coating a substrate layer with a metal oxide nanoparticle ink composition; a reducing sintering step of performing a reducing sintering process by irradiating the formed metal oxide thin film with a sintering laser to form the conductive layer; and a cleaning step of cleaning a non-sintered metal oxide thin film.

According to the present invention, the sintering laser is focused to have a predetermined size, and the reducing sintering may be performed in a predetermined pattern in the reducing sintering step by irradiating a laser according to the predetermined pattern.

According to the present invention, the metal oxide nanoparticle ink composition may include: a first solvent; nickel oxide nanoparticles dispersed in the first solvent; and polyvinylpyrrolidone (PVP).

According to the present invention, the metal oxide nanoparticle ink composition may further include hexadecyltrimethylammonium bromide (CTAB) dispersed in the first solvent.

According to the present invention, the first solvent may be 1-pentanol.

According to the present invention, the metal oxide nanoparticle ink composition may include 25 g to 30 g of nickel oxide nanoparticles, 2 g to 4 g of polyvinylpyrrolidone (PVP) and 0.15 g to 0.25 g of hexadecyltrimethylammonium bromide (CTAB) per 100 ml of 1-pentanol.

According to the present invention, the substrate layer may be formed of a material selected from the group of flexible materials including polyethylene terephthalate (PET) and polyimide (PI).

According to the present invention, the sintering laser is a 532 nm CW Nd:YVO4 laser, and the sintering laser may be focused to have a size of 15 μm to 25 μm.

According to an embodiment of the present invention, the conductive layer pattern is formed by using the laser sintering on the nickel oxide nanoparticle ink composition, so that a fine conductive layer pattern can be formed.

According to an embodiment of the present invention, the conductive layer pattern is formed by using the ink composition in which the nickel oxide nanoparticles are uniformly dispersed, so that the conductive layer pattern can have high transmittance and high conductivity.

According to the method of forming the conductive layer pattern of an embodiment of the present invention, an influence on the substrate layer is minimized when the nickel oxide is sintered by laser, so that a nickel pattern conductive layer can be formed on a transparent flexible substrate such as PET.

The method of forming the conductive layer pattern according to an embodiment of the present invention can be operated by a program, and the pattern can be directly formed on various substrates without a masking process.

According to the method of forming the conductive layer pattern of an embodiment of the present invention, CAD data for the pattern is modified to adjust a pitch of the conductive layer, so that transmittance and resistance of the conductive layer can be easily adjusted.

According to the method of forming the conductive layer pattern of an embodiment of the present invention, the conductive layer pattern can be formed without performing a vacuum process.

The conductive layer formed by the method of forming the conductive layer pattern according to an embodiment of the present invention can have excellent mechanical properties and high durability.

The conductive layer formed by the method of forming the conductive layer pattern according to an embodiment of the present invention can have high thermal stability and corrosion resistance to oxidation.

BRIEF DESCRIPTION OF THE DRAWINGS

FIG. 6 is a graph showing the relationship between pitch, wavelength, and transmittance of a conductive layer formed by a method of forming a conductive layer pattern according to an embodiment of the present invention.

FIG. 7 is a graph showing the relationship between pitch, resistance, and transmittance of a conductive layer formed by a method of forming a conductive layer pattern according to an embodiment of the present invention.

FIG. 8 is a flowchart schematically showing a method of forming a metal oxide nanoparticle ink composition for forming a conductive layer pattern according to an embodiment of the present invention.

FIGS. 9A and 9B are photographs showing a second solution and a metal oxide nanoparticle ink in the process of producing a metal oxide nanoparticle ink composition according to an embodiment of the present invention.

FIGS. 11A and 11B are SEM images of a conductive layer pattern formed by a method of forming a conductive layer pattern according to an embodiment of the present invention.

DETAILED DESCRIPTION OF THE INVENTION

Figure 1:
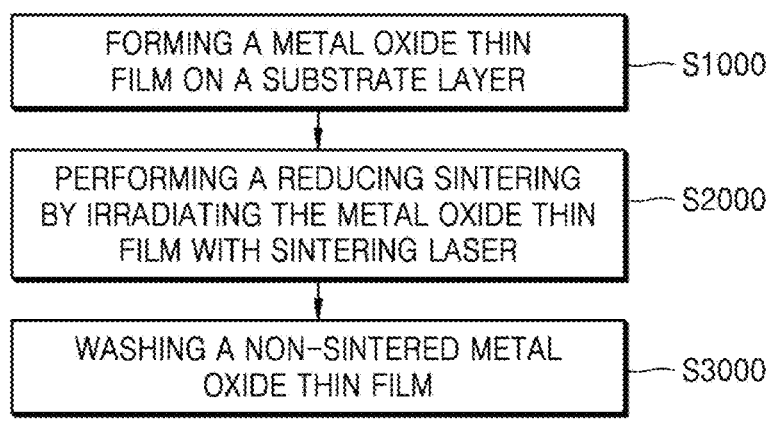
FIG. 1 is a flowchart schematically showing a method of forming a conductive layer pattern according to an embodiment of the present invention.

Hereinafter, various embodiments and/or aspects will be described with reference to the drawings. In the following description, a plurality of specific details are set forth to provide comprehensive understanding of one or more aspects for the purpose of explanation. However, it shall also be appreciated by those having ordinary skill in the art that such aspect(s) may be carried out without the specific details.

The following description and accompanying drawings will be set forth in detail for specific illustrative aspects among one or more aspects. However, the aspects are merely illustrative, some of various ways among principles of the various aspects may be employed, and the descriptions set forth herein are intended to include all the various aspects and equivalents thereof.

In addition, various aspects and features will be presented by a system that may include a plurality of devices, components and/or modules or the like.

It shall also be understood and appreciated that the system may include additional devices, components and/or modules or the like, and/or may not include all the devices, components, modules or the like recited with reference to the drawings.

The terms "embodiment", "example", "aspect", "illustration" or the like used herein may not be construed in that an aspect or design set forth herein is preferable or advantageous than other aspects or designs.

The terms 'unit', 'component', 'module', 'system', 'interface' or the like used in the following generally refer to a computer-related entity, and may refer to, for example, hardware, a combination of hardware and software, and software.

In addition, the terms "include" and/or "comprise" specify the presence of the corresponding feature and/or element, but do not preclude the possibility of the presence or addition of one or more other features, elements or combinations thereof.

In addition, the terms including an ordinal number such as first and second may be used to describe various elements, and the elements are not limited by the terms. The terms are used only for the purpose of distinguishing one element from another element. For example, the first element may be referred to as the second element without departing from the scope of the present invention, and similarly, the second element may also be referred to as the first element. The term "and/or" includes any one of a plurality of related listed items or a combination thereof.

In addition, unless otherwise defined in embodiments of the present invention, all terms used herein including technical or scientific terms have the same meaning as commonly understood by those having ordinary skill in the art.

Terms such as those defined in generally used dictionaries shall be interpreted to have the meaning consistent with the meaning in the context of the related art, and should not be interpreted as an ideal or excessively formal meaning unless expressly defined in an embodiment of the present invention.

A process for laminating functional materials using a solution-based process may be useful in various fields. It is because, in the process using the solution, steps are simplified and a vacuum process is removed, so that process costs can be reduced.

In addition, nickel is a material having corrosion resistance and catalytic properties and widely used as a current collector or catalyst. Nickel oxide may be used as a conductive layer or an electrode layer in a semiconductor device.

In addition, it has been found that nickel oxide can be used as a rare P-type metal oxide semiconductor material.

In addition, in a method of forming a conductive layer pattern according to an embodiment of the present invention, an ink composition containing nickel oxide nanoparticles is used, so that a conductive layer of nickel or nickel oxide may be formed. Preferably, the nickel oxide nanoparticles are pre-crystallized ultra-small nanoparticles.

The term "conductive layer" described herein is a concept including both a layer having a strong conductivity such as a conductor and a layer having a semi-conductivity. Alternatively, the term "conductive layer" described herein refers to a constantly or temporarily conductive material other than a material, such as rubber and plastic, that is typically considered as a non-conductor. In other words, the "conductive layer" herein shall be interpreted in the broadest sense.

Method of Forming Conductive Layer Pattern

FIG. 1 is a flowchart schematically showing a method of forming a conductive layer pattern according to an embodiment of the present invention.

Referring to FIG. 1, the method of forming a conductive layer pattern according to an embodiment of the present invention includes: a metal oxide thin film forming step S1000 of forming a metal oxide thin film 100 by coating a substrate layer 200 with a metal oxide nanoparticle ink composition; a reducing sintering step S2000 of performing a reducing sintering process by irradiating the formed metal oxide thin film 100 with a sintering laser to form a conductive layer 300; and a cleaning step S3000 of cleaning a non-sintered metal oxide thin film 100.

In metal oxide thin film forming step S1000, the metal oxide thin film 100 is formed by coating the substrate layer 200 with the metal oxide nanoparticle ink composition. The metal oxide nanoparticle ink composition may include nickel oxide nanoparticles, polyvinylpyrrolidone (PVP), hexadecyltrimethylammonium bromide (CTAB), and a first solvent. Preferably, the first solvent is alcohol having 5 or 6 carbon atoms. More preferably, the first solvent is 1-pentanol.

The metal oxide thin film 100 may be formed by using a coating scheme such as spin-coating, bar-coating, and dip-coating the substrate layer 200 with the metal oxide nanoparticle ink composition.

A thickness of the metal oxide thin film 100 may be adjusted by controlling the concentration of the metal oxide nanoparticle ink composition or controlling the parameters in the coating scheme.

In reducing sintering step S2000, the reducing sintering process is performed on the formed metal oxide thin film 100 by irradiating the metal oxide thin film 100 with a sintering laser.

According to an embodiment of the present invention, the metal oxide thin film 100 is formed of a metal oxide nanoparticle ink composition including nickel oxide nanoparticles, polyvinylpyrrolidone (PVP), and 1-pentanol.

In this case, the sintering laser is focused to have a predetermined size, and the sintering laser is irradiated according to a predetermined pattern, so that so that the reducing sintering may be performed in the predetermined pattern. According to an embodiment of the present invention, the sintering laser is a 532 nm CW Nd:YVO4 laser, and the sintering laser may be focused to have a size of 15 μm to 25 μm. Preferably, the sintering laser has at least one wavelength. More preferably, the sintering laser has a wavelength of 500 nm to 560 nm. The laser having various wavelengths is irradiated, so that the metal oxide thin film 100 may absorb energy.

The reducing mechanism by the sintering laser is as follows.

When the laser is irradiated onto a solution containing nickel oxide nanoparticles, polyvinylpyrrolidone (PVP) and 1-pentanol, a hydroxyl group of 1-pentanol and a lactam ring of polyvinylpyrrolidone (PVP) are reacted, and thus amorphous carbon, methylene gas, methylamine gas and propionic acid are generated. The propionic acid is decomposed into formic acid, thereby reducing nickel oxide into nickel. The above process may be expressed as the following formula.

$(C_6H_9NO)_n + C_5H_{11}OH \rightarrow \frac{1}{2}C_4$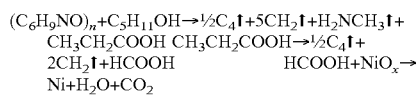$+5CH_2$↑$+H_2NCH_3$↑$+CH_3CH_2COOH$  $CH_3CH_2COOH \rightarrow \frac{1}{2}C_4$↑$+2CH_2$↑$+HCOOH$  $HCOOH+NiO_x \rightarrow Ni+H_2O+CO_2$ Accordingly, the metal oxide thin film 100 formed of the metal oxide nanoparticle ink composition containing nickel oxide nanoparticles, polyvinylpyrrolidone (PVP) and 1-pentanol is irradiated with the sintering laser, so that sintered nickel may be obtained.

Herein, the metal oxide nanoparticle ink composition may further include hexadecyltrimethylammonium bromide (CTAB) as a dispersant.

The hexadecyltrimethylammonium bromide (CTAB) can allow the nickel oxide nanoparticles to be uniformly dispersed in the 1-pentanol, and impart stability to the dispersion. More particularly, compared to a nanoparticle solution without addition of hexadecyltrimethylammonium bromide (CTAB), a nanoparticle solution with addition of hexadecyltrimethylammonium bromide (CTAB) can remarkably expand a storage period for maintaining proper dispersion of the nanoparticles without clumping, which may lead to an industrially/commercially advantageous effect.

In addition, due to the improved dispersion stability, the hexadecyltrimethylammonium bromide (CTAB) can eventually increase the final conductivity of an electrode when the electrode is formed by laser sintering.

Additionally, the sintering can be performed even by a laser having low output in reducing sintering step S2000. Accordingly, process costs can be reduced (energy required for the process can be reduced) as a whole. Although a mechanism of the effect of CTAB on a laser process has not yet been clarified theoretically, it is presumed that CATB not only contributes to improvement of dispersion stability of nanoparticles but also serves as a reducing agent.

Accordingly, since the nickel oxide nanoparticles are uniformly dispersed, a conductive layer having uniform quality can be formed when the reducing sintering is performed by irradiating the metal oxide thin film 100, which is formed of the metal oxide nanoparticle ink composition, with the sintering laser.

As described above, the metal oxide thin film 100 containing nickel oxide is irradiated with the laser and reduced to form a conductive layer pattern, so that processes can proceed in a low temperature environment, and the conductive layer pattern forming process can be performed without creating an inert gas environment or performing post-processing.

In addition, in reducing sintering step S2000, an influence on the substrate layer 200 due to the sintering laser is minimized, so that a nickel pattern conductive layer can be formed on a transparent flexible substrate such as PET.

In cleaning step S3000, the non-sintered metal oxide thin film 100 is cleaned.

In cleaning step S3000, the metal oxide thin film 100 is rinsed with water or an organic solvent, so that the non-sintered portion in reducing sintering step S2000 can be easily removed while the conductive layer pattern sintered and adhering to the substrate layer 200 is maintained.

Figure 2:
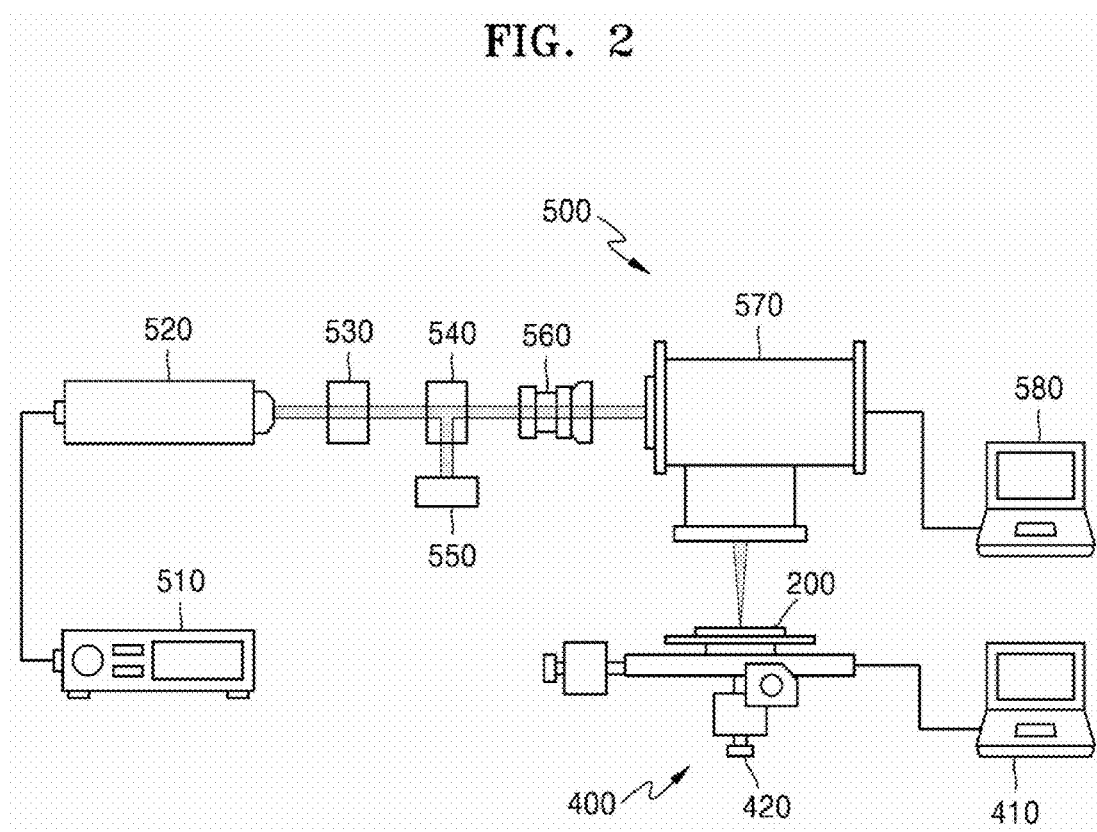
FIG. 2 is a view schematically showing a laser irradiation system used in a method of forming a conductive layer pattern according to an embodiment of the present invention.

FIG. 2 is a view schematically showing a laser irradiation system used in a method of forming a conductive layer pattern according to an embodiment of the present invention.

As shown in FIG. 2, the laser irradiation system includes a stage unit 400 and a laser beam irradiation unit 500.

The stage unit 400 includes an XYZ-tilting stage 420 capable of moving or tilting in the X-Y-Z directions, and a stage controller 410 for controlling operations of the XYZ-tilting stage 420.

In addition, the laser beam irradiation unit 500 includes: a laser beam generator 520; a laser beam controller 510 for performing a control related to laser beam generation of the laser beam generator; a half wave plate 530 through which laser generated in the laser beam generator and emitted to the outside passes; a polarization beam splitter 540; a beam dump 550 installed around the polarization beam splitter 540; an expander 560; a galvanometer scanner 570; and a galvanometer controller 580 for controlling operations of the galvanometer scanner 570.

In addition, the galvanometer controller 580, the laser beam controller 510, and the stage controller 410 may be connected to at least one computing device (not shown), and a user may perform the programmed reducing sintering step S2000 through the computing device.

Figure 3A:
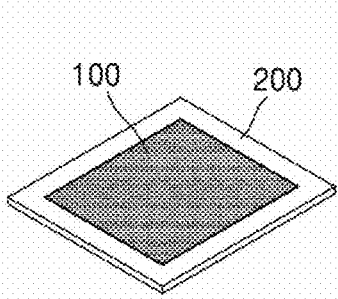
FIGS. 3A, 3B and 3C are views schematically showing steps for a method of forming a conductive layer pattern according to an embodiment of the present invention.
Figure 3B:
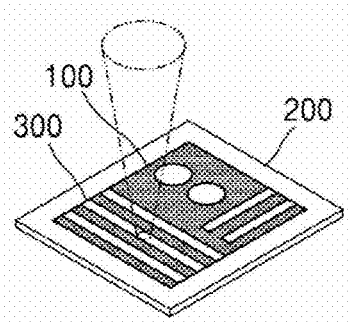
Figure 3C:
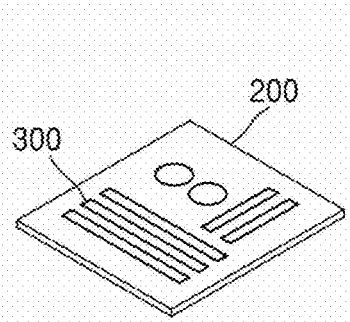

FIGS. 3A, 3B and 3C are views schematically showing steps for a method of forming a conductive layer pattern according to an embodiment of the present invention.

FIG. 3A is a view showing the metal oxide thin film 100 and the substrate layer 200 formed by the metal oxide thin film forming step S1000 according to an embodiment of the present invention. In metal oxide thin film forming step S1000, the metal oxide thin film 100 is generated by using the metal oxide nanoparticle ink composition on the substrate layer 200.

FIG. 3B is a view showing a state where reducing sintering step S2000 according to an embodiment of the present invention is performed. In reducing sintering step S2000, the reducing sintering process is performed by irradiating the metal oxide thin film 100 with the sintering laser to form the conductive layer 300. Accordingly, when the sintering laser is irradiated, the sintering laser is irradiated according to a predetermined pattern, so that the reducing sintering may be performed in a predetermined pattern. Herein, as shown in FIG. 2, the laser may be irradiated in the predetermined pattern by using the XYZ-tilting stage 420 and the galvanometer scanner 570. The above pattern may be inputted or created through the computing device, and when the stage controller 410 and the galvanometer controller 580 are controlled, the reducing sintering is performed on the metal oxide thin film 100 in the predetermined pattern.

When the conductive layer pattern is formed in the above manner, the laser is irradiated in the predetermined pattern by using the XYZ-tilting stage 420 and the galvanometer scanner 570 controllable through the computing device, so that the pattern can be easily changed.

FIG. 3C is a view showing a state where cleaning step S3000 according to an embodiment of the present invention is performed. In reducing sintering step S2000, portions coming into contact with the laser irradiating the metal oxide thin film 100 are sintered to form the conductive layer 300, and non-sintered portions are washed away when the cleaning is performed, so that only the conductive layer 300 remains.

Figure 4:
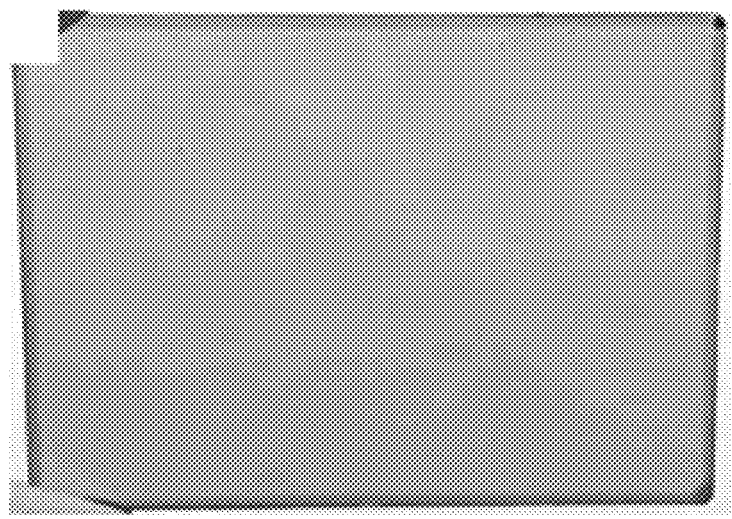
FIG. 4 is a photograph showing a metal oxide thin film formed in a method of forming a conductive layer pattern according to an embodiment of the present invention.

FIG. 4 is a photograph showing a metal oxide thin film formed in a method of forming a conductive layer pattern according to an embodiment of the present invention.

FIG. 4 is a photograph of the metal oxide thin film 100 including nickel oxide nanoparticles formed on the substrate layer 200 formed of a glass according to the method of forming the conductive layer pattern of an embodiment of the present invention.

As shown in FIG. 4, the metal oxide thin film 100 formed on the glass substrate has a semitransparent property due to a thin thickness.

In reducing sintering step S2000 according to an embodiment of the present invention, the nickel oxide contained in the metal oxide thin film 100 is reduced by irradiating the laser, so that the nickel conductive layer 300 is formed. Herein, the metal oxide thin film 100 is formed of a metal oxide nanoparticle ink composition including nickel oxide nanoparticles, polyvinylpyrrolidone (PVP), and 1-pentanol. The polyvinylpyrrolidone (PVP) and 1-pentanol serve to lower the reduction temperature of the nickel oxide nanoparticles. In other words, in reducing sintering step S2000, the reducing sintering is performed at a relatively low temperature.

Therefore, in an embodiment of the present invention, the substrate layer 200 may be formed of a material selected from the group of flexible materials including polyethylene terephthalate (PET) and polyimide (PI), and the sintering may be performed without damage to the polymer substrate layer 200 even when the reducing sintering is performed on the polymer substrate layer 200.

Figure 5A:
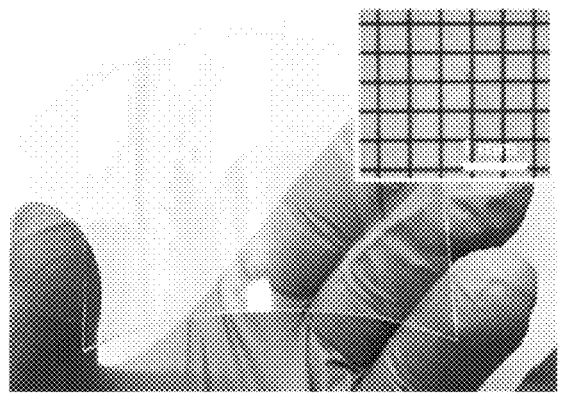
FIGS. 5A and 5B are photographs showing a conductive layer patterns formed on a flexible substrate by a method of forming a conductive layer pattern according to an embodiment of the present invention.
Figure 5B:
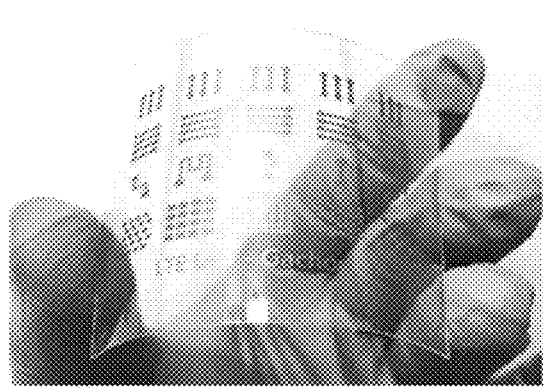

FIGS. 5A and 5B show the conductive layers formed on the polyethylene terephthalate (PET) substrate layer by the method of forming a conductive layer pattern according to an embodiment of the present invention.

FIG. 5A is a photograph of a mesh-patterned nickel conductive layer 300 having a pitch of 500 μm and formed on the polyethylene terephthalate (PET) substrate layer 200. An optical microscope photograph of the conductive layer 300 is shown at an upper right corner of FIG. 5A. As shown in FIG. 5A, it is confirmed that the conductive layer 300 is formed on the polyethylene terephthalate (PET) substrate layer 200 after irradiated with the sintering laser, but there is no damage to the substrate layer 200.

In addition, when the conductive layer 300 is formed as described above, various patterns may be formed on the conductive layer 300 by merely modifying CAD data of the conductive layer pattern. FIG. 5B is a photograph of the conductive layer 300 formed in various patterns on the polyethylene terephthalate (PET) substrate layer 200 as described above.

FIG. 6 is a graph showing the relationship between pitch, wavelength, and transmittance of a conductive layer formed by a method of forming a conductive layer pattern according to an embodiment of the present invention.

FIG. 6 shows the correlation between the transmittance (%) of the mesh-patterned nickel conductive layer 300 formed by the method of forming a conductive layer pattern according to an embodiment of the present invention and the pitch size of the mesh-pattern. It is confirmed that the transmittance is higher when the pitch size is larger, because the transmittance is proportional to the ratio of an opened region which is not covered with the electrode in the conductive layer. Subject to the same pitch size, although there is a difference in the transmittance depending on the wavelength of light, the difference is insignificant compared to the difference according to the pitch size.

FIG. 7 is a graph showing the relationship between pitch, resistance, and transmittance of a conductive layer formed by a method of forming a conductive layer pattern according to an embodiment of the present invention.

FIG. 7 shows the correlation between the transmittance (%) of the mesh-patterned nickel conductive layer 300, which is formed on the polyethylene terephthalate (PET) substrate layer 200 by the method of forming a conductive layer pattern according to an embodiment of the present invention, and the sheet resistance (Ω/sq) of the conductive layer.

It is confirmed that, when the pitch is 500 μm, the mesh-patterned nickel conductive layer 300 indicates a high transmittance of 88.9%, and the sheet resistance is maintained at a relatively low level of 102 Ω/sq.

Accordingly, the conductive layer formed by the method of forming a conductive layer pattern according to an embodiment of the present invention can exhibit the high transmittance and the excellent conductivity.

Herein, the sheet resistance of the mesh-patterned nickel conductive layer 300, according to an embodiment of the present invention, formed on the polyethylene terephthalate (PET) substrate layer 200 is 102 Ω/sq when the pitch is 500 μm, which is not much different from 96 Ω/sq of the sheet resistance of the nickel conductive layer formed on the glass substrate layer. Herein, the output of the sintering laser used to form the mesh-patterned nickel conductive layer 300 on the polyethylene terephthalate (PET) substrate layer 200 is 20 mW when the scanning speed is 50 mm/s, which is lower than the output when the conductive layer is formed on the glass substrate layer.

Because the conductive layer having excellent properties is formed while the sintering laser having the low output is used, the conductive layer can be formed on a transparent flexible substrate such as polyethylene terephthalate (PET) and polyimide (PI) without damage to the substrate.

Metal Oxide Nanoparticles

Hereinafter, an embodiment of the method of producing metal oxide nanoparticles will be described. More specifically, an embodiment of the method of producing nickel oxide nanoparticles will be described.

The nickel oxide nanoparticles may be extracted from nickel nitrate hydrate ($Ni(NO_3)_2 \cdot xH_2O$). Preferably, the nickel nitrate hexahydrate ($Ni(NO_3)_2 \cdot xH_2O$) is nickel nitrate 6 hexahydrate ($Ni(NO_3)_2 \cdot 6H_2O$).

FIG. 8 is a flowchart schematically showing a method of forming a metal oxide nanoparticle ink composition for forming a conductive layer pattern according to an embodiment of the present invention.

Referring to FIG. 8, firstly, in first solution producing step S100, nickel nitrate hydrate ($Ni(NO_3)_2 \cdot xH_2O$) is dissolved in distilled water to produce a first solution for the nickel oxide nanoparticles.

Preferably, in first solution producing step S100, 0.25 mol to 0.5 mol of nickel nitrate hexahydrate ($Ni(NO_3)_2 \cdot 6H_2O$) per 100 ml of distilled water is dissolved.

Then, in second solution producing step S200, a second solution is produced by adding a sodium hydroxide (NaOH) solution to the first solution.

Preferably, the sodium hydroxide (NaOH) solution has a concentration of 10 M (mol/L) and is added such that pH of the second solution becomes 9.5 to 10.5.

Accordingly, sodium hydroxide (NaOH) is added to the first solution containing nickel nitrate hydrate ($Ni(NO_3)_2 \cdot xH_2O$), so that the second solution containing nickel hydroxide ($Ni(OH)_2$) is obtained.

FIG. 9A is a photograph of the second solution produced as a result of performing second solution producing step S200 according to an embodiment of the present invention. The second solution includes nickel hydroxide ($Ni(OH)_2$) produced by reacting nickel nitrate hydrate ($Ni(NO_3)_2 \cdot xH_2O$) with sodium hydroxide (NaOH), so the second solution is green.

Then, in nanoparticle producing step S300, the second solution is heated in air at 250° C. to 300° C. for 1 to 3 hours to prepare nickel oxide nanoparticles.

The nickel hydroxide ($Ni(OH)_2$) of the second solution is decomposed as the following formula through the above heat treatment, so that black non-stoichiometric nickel oxide nanoparticles may be obtained.

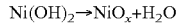

$$Ni(OH)_2 \rightarrow NiO_x + H_2O$$

Figure 10:
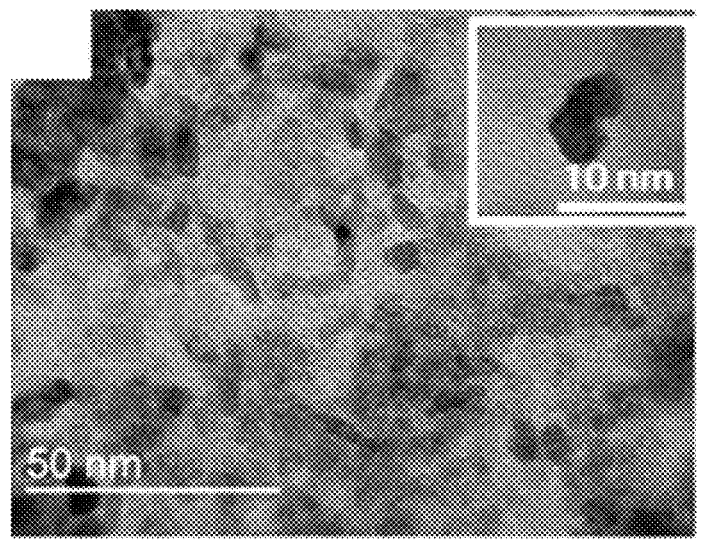
FIG. 10 is a TEM image of nickel oxide nanoparticles in the process of producing a metal oxide nanoparticle ink composition according to an embodiment of the present invention.

FIG. 10 is a TEM image of nickel oxide nanoparticles in the process of producing a metal oxide nanoparticle ink composition according to an embodiment of the present invention.

As shown in FIG. 10, the nickel oxide nanoparticles have a diameter of 3 nm to 5 nm.

Method Of Producing Metal Oxide Nanoparticle Ink Composition

FIG. 8 is a flowchart schematically showing a method of forming a metal oxide nanoparticle ink composition for forming a conductive layer pattern according to an embodiment of the present invention. The metal oxide nanoparticle ink composition according to an embodiment of the present invention may include nickel oxide ($NiO_x$) nanoparticles dispersed in a first solvent, polyvinylpyrrolidone (PVP), and hexadecyltrimethylammonium bromide (CTAB).

Preferably, the first solvent is alcohol having 5 or 6 carbon atoms. More preferably, the first solvent is 1-pentanol.

Referring to FIG. 8, in dispersion liquid producing step S400, a dispersion liquid is produced by dispersing the nickel oxide nanoparticles in a second solvent.

As described above, the nickel oxide nanoparticles may be extracted from nickel nitrate hydrate ($Ni(NO_3)_2 \cdot xH_2O$).

The second solvent is a solvent capable of dispersing the nickel oxide nanoparticles, and preferably, may be an organic solvent in which polyvinylpyrrolidone (PVP) and hexadecyltrimethylammonium bromide (CTAB) are dispersed. More preferably, the organic solvent is 1-pentanol.

The dispersion liquid according to an embodiment of the present invention may include 25 g to 30 g of nickel oxide nanoparticles, 2 g to 4 g of polyvinylpyrrolidone (PVP) and 0.15 g to 0.25 g of hexadecyltrimethylammonium bromide (CTAB) per 100 ml of 1-pentanol. A total amount of the produced dispersion liquid may be adjusted by the ratio of the above components.

When the dispersion liquid contains less than 2 g of polyvinylpyrrolidone (PVP) per 100 ml of 1-pentanol, the degree of dispersion of nickel oxide nanoparticles in the solvent is lowered, so a surface of a thin film is unevenly formed. As a result, when the electrode is formed by the laser sintering in reducing sintering step S2000, electrode quality such as conductivity and surface roughness is adversely affected. In addition, when polyvinylpyrrolidone (PVP) is less than 2 g, the reduction reaction does not occur properly in reducing sintering step S2000, so a nickel oxide electrode other than a nickel electrode may be formed.

When the dispersion liquid contains more than 4 g of polyvinylpyrrolidone (PVP) per 100 ml of 1-pentanol, the higher power is required upon laser sintering in reducing sintering step S2000, and nickel oxide is insufficiently reduced due to insufficient thermolysis of polyvinylpyrrolidone (PVP), so conductivity of the nickel electrode that is finally formed may be lowered. In addition, the adhesion, of the finally formed electrode, to the substrate layer 200 may be lowered.

Then, in ultrasonic processing step S500, an ultrasonic treatment is performed on the produced dispersion liquid. The dispersion index of the dispersion liquid may be increased through the above ultrasonic treatment. Preferably, the ultrasonic treatment is performed for 10 hours or more.

Then, in precipitate removing step S600, precipitates of the dispersion liquid subjected to ultrasonic treatment are removed. The precipitates remaining after the ultrasonic treatment are removed, so that the metal oxide nanoparticle ink composition for forming the conductive layer pattern may be produced.

FIG. 9B is a photograph of the metal oxide nanoparticle ink composition produced according to an embodiment of the present invention. Nickel oxide nanoparticles obtained after heated at 270° C. for 2 hours are shown at the upper right corner of FIG. 9B. The main photograph shows a metal oxide nanoparticle ink composition produced by dispersing the above nickel oxide nanoparticles in a second solvent.

The second solvent includes polyvinylpyrrolidone (PVP), hexadecyltrimethylammonium bromide (CTAB) and 1-pentanol.

Pattern Conductive Layer

FIGS. 11A and 11B are SEM images of a conductive layer pattern formed by a method of forming a conductive layer pattern according to an embodiment of the present invention.

FIG. 11A is an SEM image of the mesh-patterned conductive layer 300 formed on the glass substrate layer 200.

Elemental mapping images of oxygen and nickel are shown at upper left and upper right corners, respectively. In an embodiment of FIG. 11, the sintering laser used to form the mesh-patterned conductive layer 300 was focused and irradiated in a diameter of 20 μm.

FIG. 11B is an enlarged SEM image of the mesh-patterned conductive layer 300. Referring to FIG. 11B, the line width of the mesh-pattern is about 31 μm. The width of the formed conductive layer 300 is wider than the diameter of the sintering laser due to heat distribution.

In addition, it is confirmed that the region that is not irradiated with the laser is cleaned through cleaning step S3000 except for the conductive layer 300 formed after irradiated with the sintering laser, and thus the conductive layer 300 having a predetermined mesh-pattern is formed.

Figure 12:
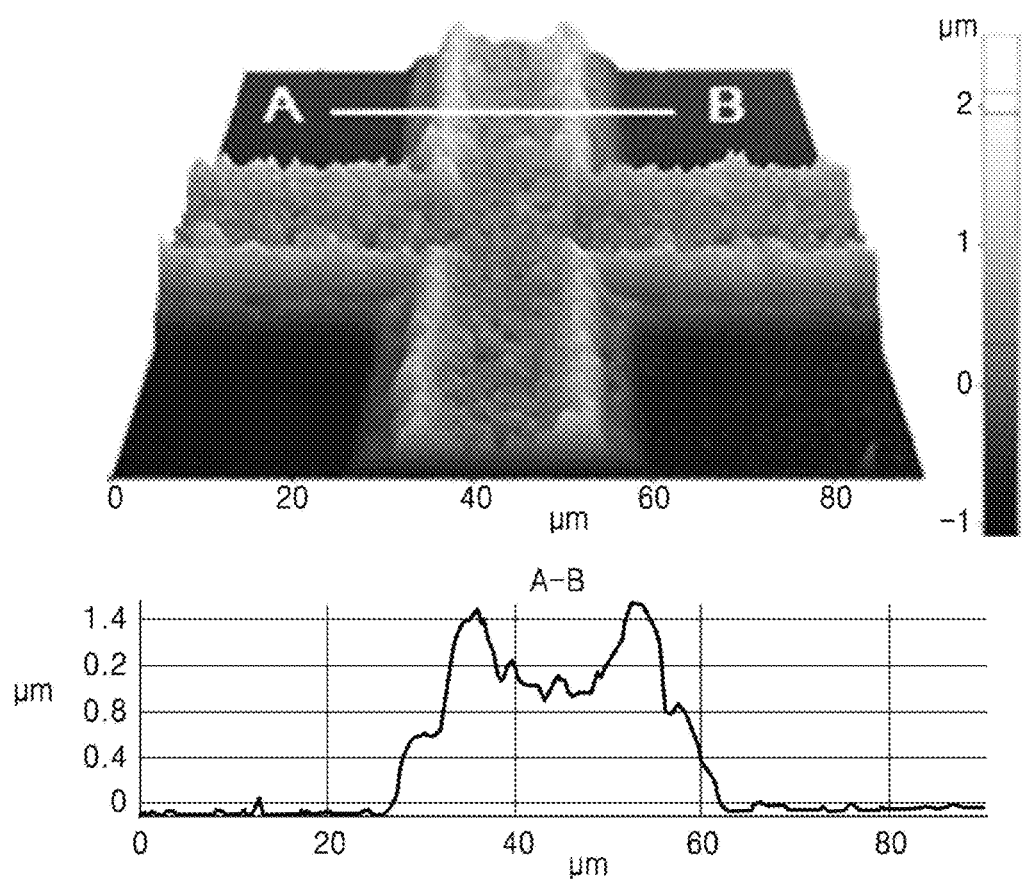
FIG. 12 is an AFM image of a conductive layer pattern formed by a method of forming a conductive layer pattern according to an embodiment of the present invention.

FIG. 12 is an AFM image of a conductive layer pattern formed by a method of forming a conductive layer pattern according to an embodiment of the present invention.

FIG. 12 is an AFM image of an intersecting point in the mesh-patterned conductive layer 300. Referring to FIG. 12, it is confirmed that the line width of the mesh-pattern is about 30 µm, the thickness of the conductive layer is about 1.2 µm, and a root mean square (rms) value of surface roughness of a central region of the pattern line of the conductive layer 300 is about 6.21 nm.

Figure 13:
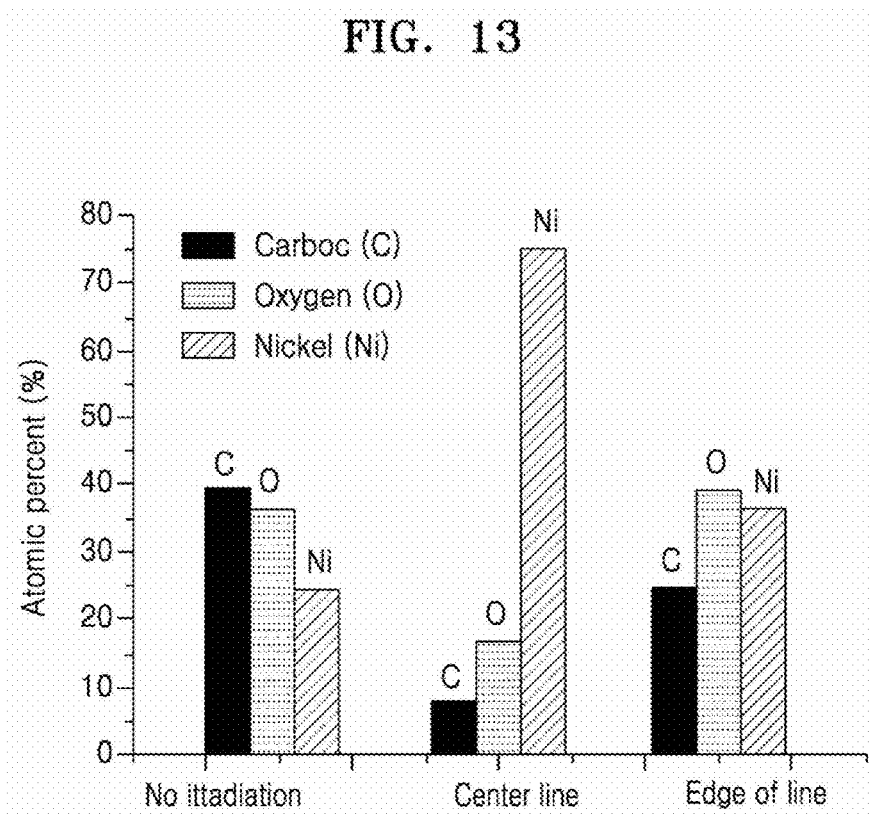
FIG. 13 is a graph showing the chemical composition ratio of a metal oxide thin film in a method of forming a conductive layer pattern according to an embodiment of the present invention.

FIG. 13 is a graph showing the chemical composition ratio of a metal oxide thin film in a method of forming a conductive layer pattern according to an embodiment of the present invention.

Referring to FIG. 13, the region that is not irradiated with the laser accounts for about 39% of carbon, about 36% of oxygen, and about 25% of nickel.

Then, in the conductive layer 300 formed after the sintering laser is irradiated on the metal oxide thin film 100, a center of the conductive layer pattern line accounts for about 8% of carbon, about 17% of oxygen, and about 76% of nickel, in which the ratio of nickel is very high. An edge of the pattern line accounts for about 25% of carbon, about 39% of oxygen, and about 36% of nickel.

As a result, the center of the pattern line directly irradiated with the sintering laser is sintered with nickel, thereby causing the composition ratio of nickel to be very high. In addition, the composition ratio of nickel at the edge sintered by the heat distribution due to the irradiated sintering laser is slightly higher, but the ratio is not significantly different from the chemical composition ratio at the region which is not irradiated with the laser.

Figure 14:
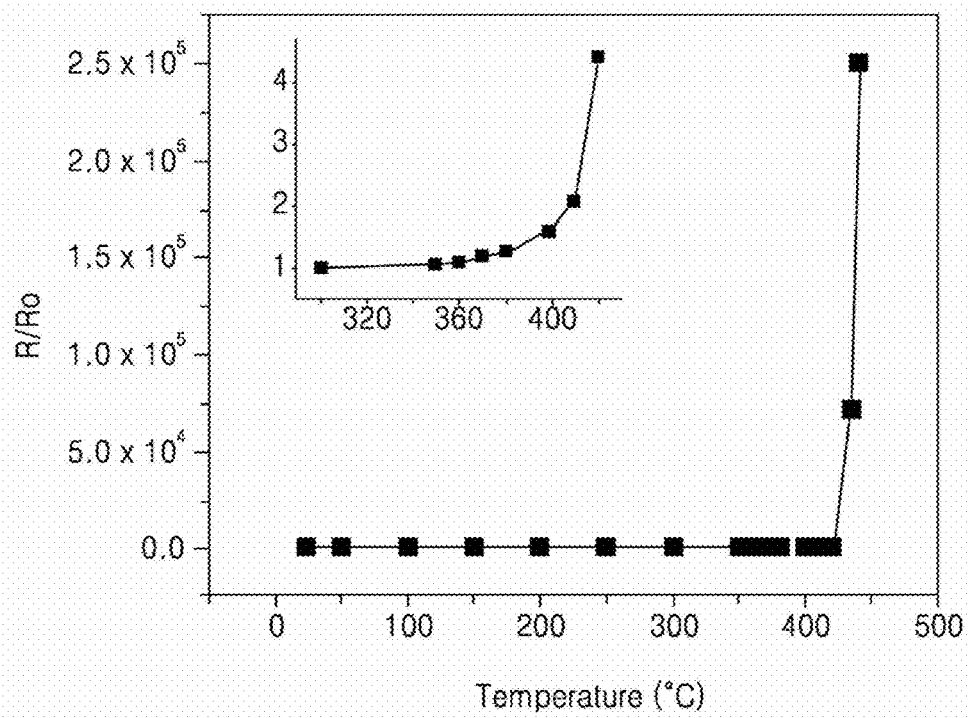
FIG. 14 is a graph showing a resistance change, upon temperature, of a conductive layer pattern formed by a method of forming a conductive layer pattern according to an embodiment of the present invention.

FIG. 14 is a graph showing a resistance change, upon temperature, of a conductive layer pattern formed by a method of forming a conductive layer pattern according to an embodiment of the present invention.

A heating test was performed to check the thermal stability of the nickel conductive layer pattern formed according to an embodiment of the present invention.

In the heating test, the conductive layer 300 formed on the glass substrate layer 200 according to the embodiment of the present invention was heated at 23° C. to 440° C. for 5 minutes in a heating plate in air, and then cooled to room temperature (23° C.), and the resistance change was measured at both ends of the conductive layer 300.

The ratio of the measured resistance value R to an initial resistance value RO is shown in FIG. 14. Referring to FIG. 14, the resistance value was recovered to have the rate of resistance change of 9% or less until 350° C. Then, as shown in an upper left corner of FIG. 14, the rate of resistance change was rapidly increased up to 440° C. beyond annealing temperature. From 440° C., the resistance value was increased to infinity, so it is understood that the nickel conductive layer is completely oxidized.

Accordingly, it is confirmed that the conductive layer 300 formed according to the embodiment of the present invention has excellent thermal stability up to about 350° C.

Figure 15:
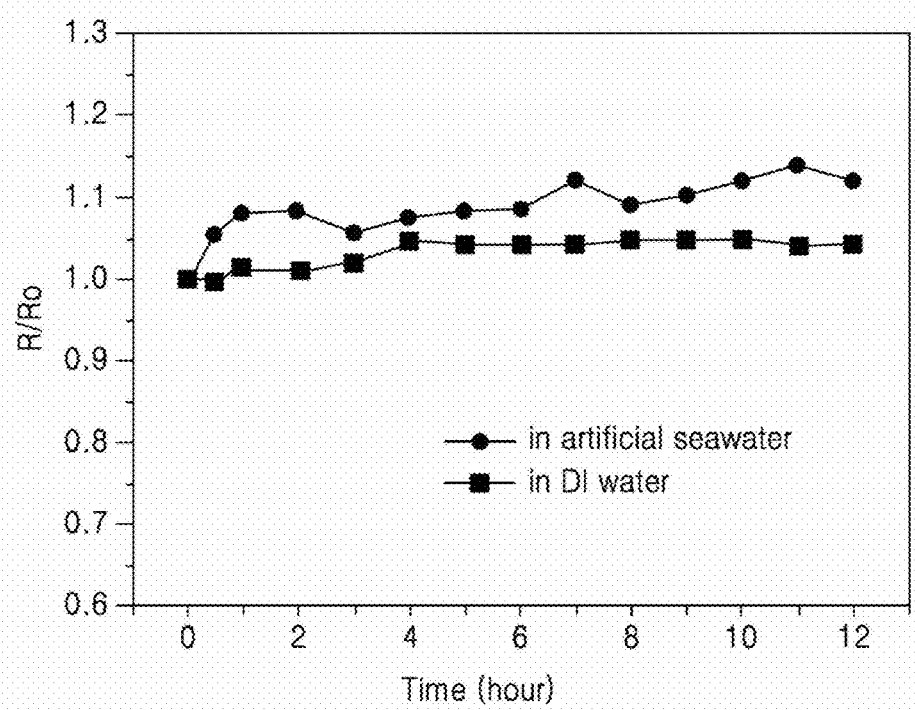
FIG. 15 is a graph showing a resistance change, upon time in a wet environment, of a conductive layer pattern formed by a method of forming a conductive layer pattern according to an embodiment of the present invention.

FIG. 15 is a graph showing a resistance change, upon time in a wet environment, of a conductive layer pattern formed by a method of forming a conductive layer pattern according to an embodiment of the present invention.

A test was performed to check the corrosion resistance of the nickel conductive layer pattern formed according to an embodiment of the present invention.

In the above test, the conductive layer 300 formed on the glass substrate layer 200 according to the embodiment of the present invention was put in distilled water and artificial seawater (prepared by dissolving 3.5 g of sodium chloride in 100 ml of distilled water), and the resistance change according to time was measured at both ends of the conductive layer 300.

The ratio of the measured resistance value R to an initial resistance value RO is shown in FIG. 15. Referring to FIG. 15, it is confirmed that the ratio of resistance change was within 15% until 12 hours after the dried nickel conductive layer 300 was immersed in distilled water and artificial seawater. In contrast, the copper electrode was rapidly oxidized in 5 minutes after immersion in artificial seawater.

In addition, the resistance value of the nickel conductive layer 300 formed according to the embodiment of the present invention was not changed for more than 2 months in a normal environment.

As described above, it is confirmed that the conductive layer 300 formed according to one embodiment of the present invention has the remarkably excellent corrosion resistance.

Figure 16A:
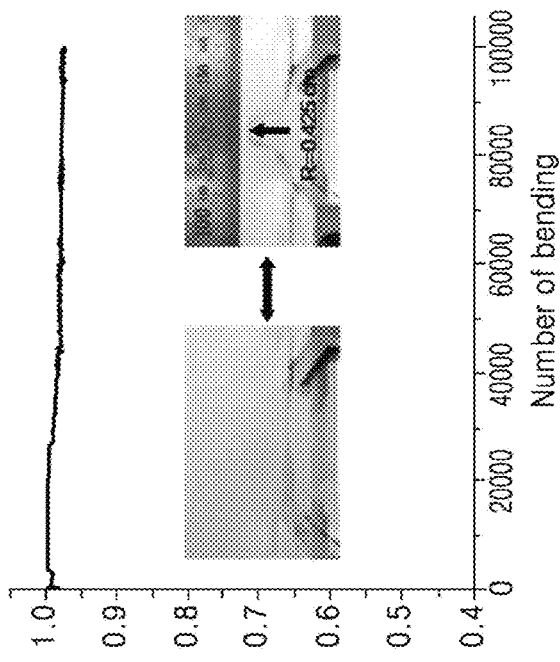
FIGS. 16A and 16B are views showing a bending test result of a conductive layer formed on a flexible substrate by a method of forming a conductive layer pattern according to an embodiment of the present invention.
Figure 16B:
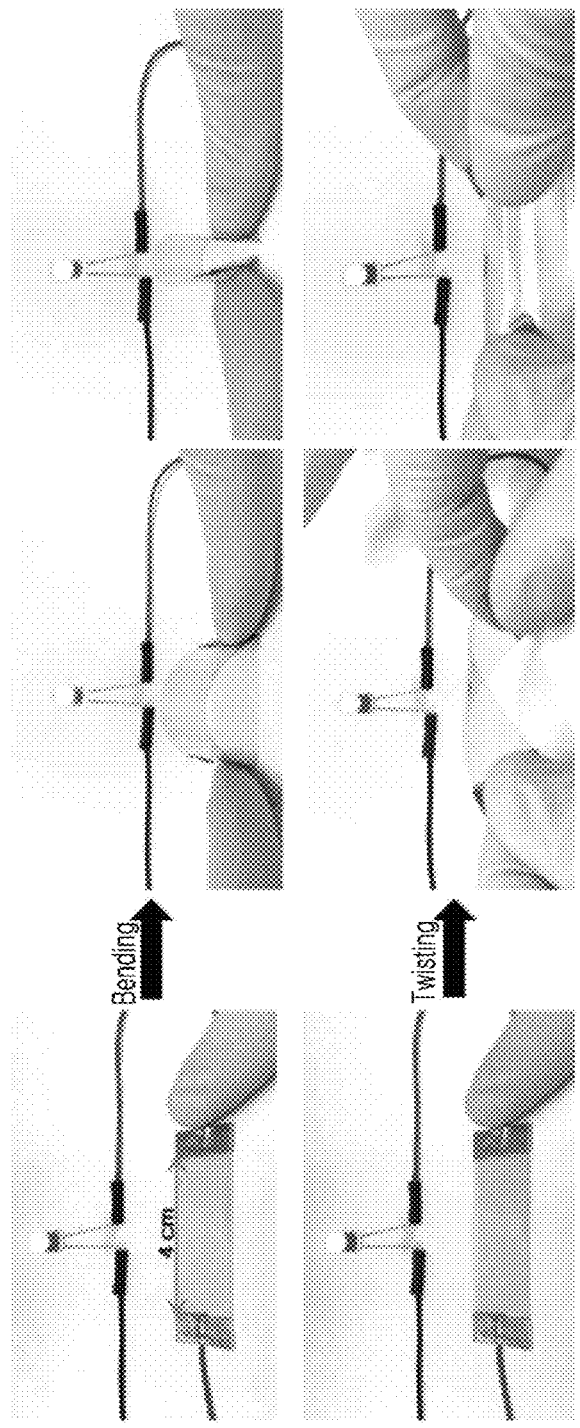

FIGS. 16A and 16B are views showing bending test results of a conductive layer formed on a flexible substrate by a method of forming a conductive layer pattern according to an embodiment of the present invention.

The following experiment was performed to evaluate mechanical properties of the conductive layer formed on the flexible substrate by the method of forming the conductive layer pattern according to one embodiment of the present invention.

A mesh-patterned conductive layer 300 having a size of 2.5 cm by 4.5 cm was formed on the PET substrate layer 200, a copper tape was attached to both ends of the conductive layer 300, and the both ends were attached to a linear stage. A bending test was performed in which one end of the linear stage was fixed and the other end was repeatedly moved to allow the conductive layer 300 to be bent (bending radius=0.425 cm), and the resistance value of the conductive layer 300, upon every moving cycle, was measured when the conductive layer 300 was unfolded.

The ratio of the measured resistance value R to an initial resistance value RO is shown in FIG. 16a. Referring to FIG. 16a, it is confirmed that the ratio of resistance change is within 4% even after 100,000 bending times.

As described above, the conductive layer 300 formed according to the embodiment of the present invention can have remarkably excellent bending resistance since the PET substrate layer 200 and the conductive layer 300 strongly adhere to each other.

In addition, a 3.5 V blue LED circuit was configured using the transparent mesh-patterned conductive layer 300 formed on the PET substrate layer 200 to evaluate the mechanical stability. FIG. 16b shows that the LED emits light in the blue LED circuit including the transparent mesh-patterned conductive layer 300. Herein, the transparent mesh-patterned conductive layer 300 was bent or twisted to check a light emitting state of the blue LED. As shown in FIG. 16b, even when the transparent mesh-patterned conductive layer 300 is bent or twisted, any change in brightness of the LED was not detected.

Accordingly, the conductive layer 300 formed according to one embodiment of the present invention has excellent mechanical properties, thereby serving as a stable electrode even on the substrate layer 200 formed of a flexible material.

Figure 17A:
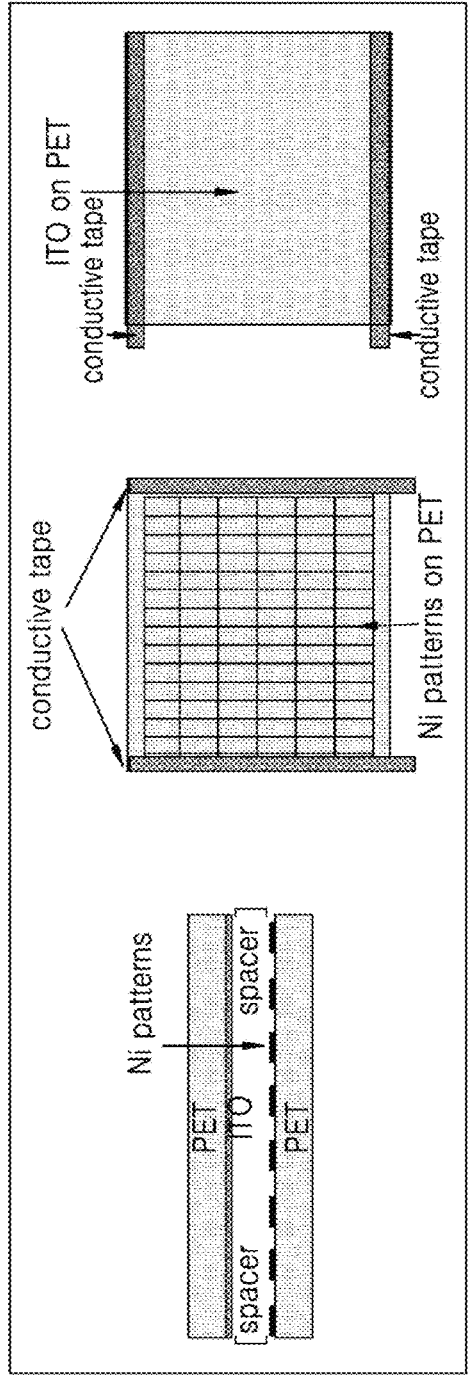
FIGS. 17A, 17B and 17C are views showing a touch screen panel manufactured by a method of forming a conductive layer pattern according to an embodiment of the present invention.
Figure 17C:
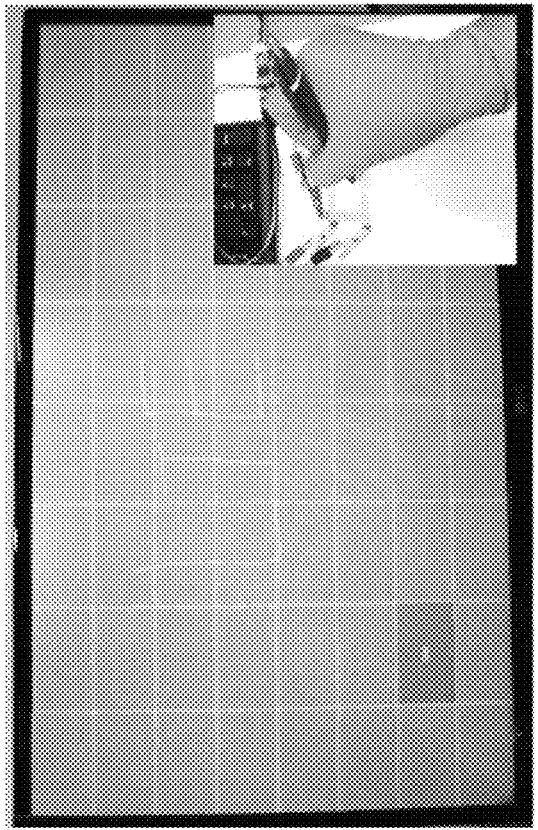
Figure 17B:
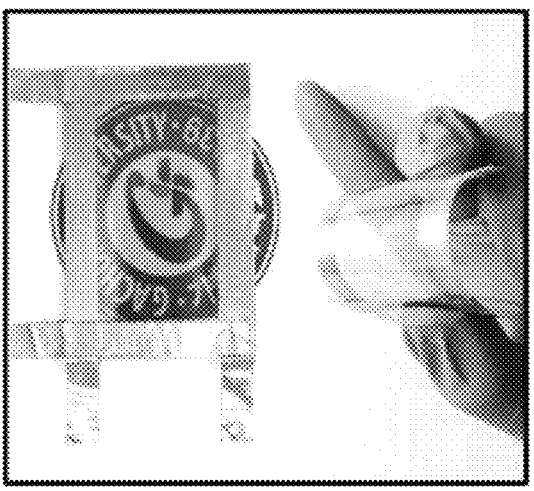

FIGS. 17A, 17B and 17C are views showing a touch screen panel manufactured by a method of forming a conductive layer pattern according to an embodiment of the present invention.

The patterned conductive layer manufactured by the method of forming the conductive layer pattern according to an embodiment of the present invention may be used for manufacturing a touch screen panel or the like. As shown in FIG. 17a, the touch screen panel is a transparent flexible four-wire-type touch screen panel.

The touch screen panel uses a mesh-patterned nickel conductive layer 300 having a size of 2.5 cm by 4.5 cm and formed on the PET substrate layer 200 by the method of forming the conductive layer pattern according to an embodiment of the present invention, as a first transparent electrode. The mesh-patterned nickel conductive layer 300 has a pitch of 300 μm. Herein, the sheet resistance of the conductive layer is about 52.8 Ω/sq, and the transmittance is about 84% at 550 nm. Since the mesh-patterned nickel conductive layer 300 is excellent in corrosion resistance, an additional protective layer is unnecessary.

An indium tin oxide-polyethylene terephthalate (ITO-PET) film is used for a second transparent electrode. The sheet resistance of the ITO-PET film is about 60 Ω/sq, and the transmittance is about 79% at 550 nm.

A copper tape is attached to both ends of the mesh-patterned nickel conductive layer 300 and the ITO-PET film. FIG. 17b shows a transparent flexible touch screen panel which is actually fabricated.

The transparent flexible touch screen panel is connected to a commercial USB interface touch screen controller through the copper tape. As shown in FIG. 17c, it is confirmed that the touch screen panel fabricated in the above manner was operated normally, by drawing a specific letter (LTE) thereon.

Accordingly, the patterned nickel conductive layer is directly formed on the PET substrate layer which is a transparent flexible material, so that a transparent flexible electrode having excellent performance can be manufactured and used in various fields.

According to an embodiment of the present invention, the conductive layer pattern is formed by using the laser sintering on the nickel oxide nanoparticle ink composition, so that a fine conductive layer pattern can be formed.

According to an embodiment of the present invention, the conductive layer pattern is formed by using the ink composition in which the nickel oxide nanoparticles are uniformly dispersed, so that the conductive layer pattern can have high transmittance and high conductivity.

According to the method of forming the conductive layer pattern of an embodiment of the present invention, an influence on the substrate layer is minimized when the nickel oxide is sintered by laser, so that a nickel pattern conductive layer can be formed on a transparent flexible substrate such as PET.

The method of forming the conductive layer pattern according to an embodiment of the present invention can be operated by a program, and the pattern can be directly formed on various substrates without a masking process.

According to the method of forming the conductive layer pattern of an embodiment of the present invention, CAD data for the pattern is modified to adjust a pitch of the conductive layer, so that transmittance and resistance of the conductive layer can be easily adjusted.

According to the method of forming the conductive layer pattern of an embodiment of the present invention, the conductive layer pattern can be formed without performing a vacuum process.

The conductive layer formed by the method of forming the conductive layer pattern according to an embodiment of the present invention can have excellent mechanical properties and high durability.

The conductive layer formed by the method of forming the conductive layer pattern according to an embodiment of the present invention can have high thermal stability and corrosion resistance to oxidation.

Although the above embodiments have been described with reference to the limited embodiments and drawings, however, it will be understood by those skilled in the art that various changes and modifications may be made from the above-mentioned description. For example, even when the described techniques are conducted in an order different from the descriptions, and/or the described components such as system, structure, device, and circuit may be coupled or combined in a form different from the described manner, or replaced or substituted by other components or equivalents, appropriate results may be achieved. Therefore, other implementations, other embodiments, and equivalents to the claims are also within the scope of the following claims.

What is claimed is:

1. A method of forming a conductive layer pattern, the method comprising:
    a metal oxide thin film forming step of forming a metal oxide thin film by coating a substrate layer with a metal oxide nanoparticle ink composition;
    a reducing sintering step of performing a reducing sintering by irradiating the formed metal oxide thin film with a sintering laser to form the conductive layer; and
    a cleaning step of cleaning a non-sintered metal oxide thin film, wherein
    the metal oxide nanoparticle ink composition includes
    a first solvent including 1-pentanol;
    nickel oxide nanoparticles dispersed in the first solvent; and
    polyvinylpyrrolidone (PVP), wherein the metal oxide nanoparticle ink composition includes 25 g to 30 g of the nickel oxide nanoparticles, 2 g to 4 g of the polyvinylpyrrolidone (PVP) and 0.15 g to 0.25 g of hexadecyltrimethylammonium bromide (CTAB) per 100 ml of 1-pentanol.

2. The method of claim 1, wherein
    the sintering laser is focused to have a predetermined size, and
    the laser is irradiated according to a predetermined pattern in the reducing sintering step, so that the reducing sintering is performed in the predetermined pattern.

3. The method of claim 1, wherein the metal oxide nanoparticle ink composition further includes hexadecyltrimethylammonium bromide (CTAB) dispersed in the first solvent.

4. The method of claim 2, wherein the sintering laser has a wavelength of 500 nm to 560 nm, and the sintering laser is focused to have a size of 15 μm to 25 μm.

* * * * *